United States Patent
Mullee

(10) Patent No.: US 6,871,656 B2
(45) Date of Patent: Mar. 29, 2005

(54) REMOVAL OF PHOTORESIST AND PHOTORESIST RESIDUE FROM SEMICONDUCTORS USING SUPERCRITICAL CARBON DIOXIDE PROCESS

(75) Inventor: William H. Mullee, Portland, OR (US)

(73) Assignee: Tokyo Electron Limited, Tokyo (JP)

(*) Notice: Subject to any disclaimer, the term of this patent is extended or adjusted under 35 U.S.C. 154(b) by 37 days.

(21) Appl. No.: 10/255,822

(22) Filed: Sep. 25, 2002

(65) Prior Publication Data

US 2003/0027085 A1 Feb. 6, 2003

Related U.S. Application Data

(62) Division of application No. 09/389,788, filed on Sep. 3, 1999, now Pat. No. 6,509,141, which is a continuation of application No. 09/085,391, filed on May 27, 1998, now Pat. No. 6,306,564.
(60) Provisional application No. 60/047,739, filed on May 27, 1997.

(51) Int. Cl.$^7$ .............................................. B08B 3/08
(52) U.S. Cl. .................... 134/103.1; 134/111; 134/186; 134/200; 134/902
(58) Field of Search ............................ 134/94.1, 95.1, 134/103.1, 111, 186, 200, 902

(56) References Cited

U.S. PATENT DOCUMENTS

| | | | |
|---|---|---|---|
| 2,617,719 A | 11/1952 | Stewart | 23/312 |
| 2,625,886 A | 1/1953 | Browne | |
| 3,744,660 A | 7/1973 | Gaines et al. | |
| 3,890,176 A | 6/1975 | Bolon | 156/2 |
| 3,900,551 A | 8/1975 | Bardoncelli et al. | 423/9 |
| 3,968,885 A | 7/1976 | Hassan et al. | |
| 4,029,517 A | 6/1977 | Rand | 134/11 |
| 4,091,643 A | 5/1978 | Zucchini | 68/18 C |
| 4,219,333 A | 8/1980 | Harris | 8/137 |
| 4,245,154 A | 1/1981 | Uehara et al. | |
| 4,341,592 A | 7/1982 | Shortes et al. | 156/643 |
| 4,355,937 A | 10/1982 | Mack et al. | |
| 4,367,140 A | 1/1983 | Wilson | |
| 4,406,596 A | 9/1983 | Budde | |
| 4,422,651 A | 12/1983 | Platts | |
| 4,474,199 A | 10/1984 | Blaudszun | 134/105 |
| 4,475,993 A | 10/1984 | Blander et al. | 204/64 T |

(Continued)

FOREIGN PATENT DOCUMENTS

| | | | | |
|---|---|---|---|---|
| DE | 39 04 514 C2 | 8/1990 | | D06L/1/00 |
| DE | 40 04 111 C2 | 8/1990 | | D06L/1/00 |
| DE | 39 06 724 C2 | 9/1990 | | D06P/1/90 |

(Continued)

OTHER PUBLICATIONS

Hideaki Itakura et al., "Multi–Chamber Dry Etching System", Solid State Technology, Apr. 1982, pp. 209–214.
Joseph L. Foszcz, "Diaphragm Pumps Eliminate Seal Problems", Plant Engineering, pp. 1–5, Feb. 1, 1996.

(Continued)

Primary Examiner—Frankie L. Stinson
Assistant Examiner—Joseph Perrin
(74) Attorney, Agent, or Firm—Haverstock & Owens LLP

(57) ABSTRACT

A method of removing a photoresist or a photoresist residue from a semiconductor substrate is disclosed. The semiconductor substrate with the photoresist or the photoresist residue on a surface of the semiconductor substrate is placed within a pressure chamber. The pressure chamber is then pressurized. Supercritical carbon dioxide and a stripper chemical are introduced to the pressure chamber. The supercritical carbon dioxide and the stripper chemical are maintained in contact with the photoresist or the photoresist residue until the photoresist or the photoresist residue is removed from the semiconductor substrate. The pressure chamber is then flushed and vented.

8 Claims, 2 Drawing Sheets

U.S. PATENT DOCUMENTS

| | | | |
|---|---|---|---|
| 4,522,788 A | 6/1985 | Sitek et al. | |
| 4,549,467 A | 10/1985 | Wilden et al. | |
| 4,592,306 A | 6/1986 | Gallego | |
| 4,601,181 A | 7/1986 | Privat | 68/18 C |
| 4,626,509 A | 12/1986 | Lyman | |
| 4,670,126 A | 6/1987 | Messer et al. | |
| 4,682,937 A | 7/1987 | Credle, Jr. | |
| 4,693,777 A | 9/1987 | Hazano et al. | 156/345 |
| 4,749,440 A | 6/1988 | Blackwood et al. | 156/646 |
| 4,778,356 A | 10/1988 | Hicks | |
| 4,788,043 A | 11/1988 | Kagiyama et al. | 422/292 |
| 4,789,077 A | 12/1988 | Noe | |
| 4,823,976 A | 4/1989 | White, III et al. | |
| 4,825,808 A | 5/1989 | Takahashi et al. | |
| 4,827,867 A | 5/1989 | Takei et al. | |
| 4,838,476 A | 6/1989 | Rahn | 228/180.1 |
| 4,865,061 A | 9/1989 | Fowler et al. | 134/108 |
| 4,877,530 A | 10/1989 | Moses | 210/511 |
| 4,879,004 A | 11/1989 | Oesch et al. | 203/89 |
| 4,879,431 A | 11/1989 | Bertoncini | |
| 4,917,556 A | 4/1990 | Stark et al. | |
| 4,923,828 A | 5/1990 | Gluck et al. | 437/225 |
| 4,924,892 A | 5/1990 | Kiba et al. | 134/123 |
| 4,933,404 A | 6/1990 | Beckman et al. | 526/207 |
| 4,944,837 A | 7/1990 | Nishikawa et al. | 156/646 |
| 4,951,601 A | 8/1990 | Maydan et al. | |
| 4,960,140 A | 10/1990 | Ishijima et al. | 134/31 |
| 4,983,223 A | 1/1991 | Gessner | 134/25.4 |
| 5,011,542 A | 4/1991 | Weil | 134/38 |
| 5,013,366 A | 5/1991 | Jackson et al. | 134/1 |
| 5,044,871 A | 9/1991 | Davis et al. | |
| 5,062,770 A | 11/1991 | Story et al. | |
| 5,068,040 A | 11/1991 | Jackson | 210/748 |
| 5,071,485 A | 12/1991 | Matthews et al. | |
| 5,105,556 A | 4/1992 | Kurokawa et al. | 34/12 |
| 5,143,103 A | 9/1992 | Basso et al. | 134/98.1 |
| 5,158,704 A | 10/1992 | Fulton et al. | 252/309 |
| 5,167,716 A | 12/1992 | Boitnott et al. | |
| 5,169,296 A | 12/1992 | Wilden | |
| 5,169,408 A | 12/1992 | Biggerstaff et al. | |
| 5,174,917 A | 12/1992 | Monzyk | 252/60 |
| 5,185,058 A | 2/1993 | Cathey, Jr. | 156/656 |
| 5,185,296 A | 2/1993 | Morita et al. | 437/229 |
| 5,186,594 A | 2/1993 | Toshima et al. | |
| 5,186,718 A | 2/1993 | Tepman et al. | |
| 5,188,515 A | 2/1993 | Horn | |
| 5,190,373 A | 3/1993 | Dickson et al. | |
| 5,191,993 A | 3/1993 | Wanger et al. | |
| 5,193,560 A | 3/1993 | Tanaka et al. | 134/56 R |
| 5,195,878 A * | 3/1993 | Sahiavo et al. | 417/393 |
| 5,201,960 A | 4/1993 | Starov | 134/11 |
| 5,213,485 A * | 5/1993 | Wilden | 417/393 |
| 5,213,619 A | 5/1993 | Jackson et al. | 134/1 |
| 5,215,592 A | 6/1993 | Jackson | 134/1 |
| 5,217,043 A | 6/1993 | Novakovic | 137/460 |
| 5,221,019 A * | 6/1993 | Pechacek et al. | 220/315 |
| 5,222,876 A * | 6/1993 | Budde | 417/393 |
| 5,224,504 A * | 7/1993 | Thompson et al. | 134/155 |
| 5,225,173 A | 7/1993 | Wai | 423/2 |
| 5,236,602 A | 8/1993 | Jackson | 210/748 |
| 5,236,669 A * | 8/1993 | Simmons et al. | 422/113 |
| 5,237,824 A | 8/1993 | Pawliszyn | 62/51.1 |
| 5,238,671 A | 8/1993 | Matson et al. | 423/397 |
| 5,240,390 A * | 8/1993 | Kvinge et al. | 417/393 |
| 5,243,821 A | 9/1993 | Schuck et al. | 62/50.6 |
| 5,246,500 A * | 9/1993 | Samata et al. | 118/719 |
| 5,250,078 A | 10/1993 | Saus et al. | 8/475 |
| 5,251,776 A * | 10/1993 | Morgan, Jr. et al. | 220/360 |
| 5,261,965 A | 11/1993 | Moslehi | 134/1 |
| 5,266,205 A | 11/1993 | Fulton et al. | 210/639 |
| 5,267,455 A | 12/1993 | Dewees et al. | 68/5 C |
| 5,269,815 A | 12/1993 | Schlenker et al. | 8/475 |
| 5,274,129 A | 12/1993 | Natale et al. | 549/349 |
| 5,280,693 A * | 1/1994 | Heudecker | 53/306 |
| 5,285,352 A * | 2/1994 | Pastore et al. | 361/707 |
| 5,288,333 A | 2/1994 | Tanaka et al. | 134/31 |
| 5,290,361 A | 3/1994 | Hayashida et al. | 134/2 |
| 5,294,261 A | 3/1994 | McDermott et al. | 134/7 |
| 5,298,032 A | 3/1994 | Schlenker et al. | 8/475 |
| 5,304,515 A | 4/1994 | Morita et al. | 437/231 |
| 5,306,350 A | 4/1994 | Hoy et al. | 134/22.14 |
| 5,312,882 A | 5/1994 | DeSimone et al. | 526/201 |
| 5,313,965 A | 5/1994 | Palen | 134/61 |
| 5,314,574 A * | 5/1994 | Takahashi | 438/706 |
| 5,316,591 A | 5/1994 | Chao et al. | 134/34 |
| 5,328,722 A | 7/1994 | Ghanayem et al. | 427/250 |
| 5,334,332 A | 8/1994 | Lee | 252/548 |
| 5,334,493 A | 8/1994 | Fujita et al. | 430/463 |
| 5,337,446 A | 8/1994 | Smith et al. | 15/21.1 |
| 5,339,844 A | 8/1994 | Stanford, Jr. et al. | 134/107 |
| 5,352,327 A | 10/1994 | Witowski | 156/646 |
| 5,355,901 A | 10/1994 | Mielnik et al. | 134/105 |
| 5,356,538 A | 10/1994 | Wai et al. | 210/634 |
| 5,364,497 A | 11/1994 | Chau et al. | 156/645 |
| 5,368,171 A | 11/1994 | Jackson | 134/147 |
| 5,370,740 A | 12/1994 | Chao et al. | 134/1 |
| 5,370,741 A | 12/1994 | Bergman | 134/3 |
| 5,370,742 A | 12/1994 | Mitchell et al. | 134/10 |
| 5,377,705 A | 1/1995 | Smith, Jr. et al. | 134/95.3 |
| 5,401,322 A | 3/1995 | Marshall | 134/13 |
| 5,403,621 A | 4/1995 | Jackson et al. | 427/255.1 |
| 5,403,665 A | 4/1995 | Alley et al. | 428/447 |
| 5,404,894 A | 4/1995 | Shiraiwa | 134/66 |
| 5,412,958 A | 5/1995 | Iliff et al. | 68/5 C |
| 5,417,768 A | 5/1995 | Smith, Jr. et al. | 134/10 |
| 5,433,334 A | 7/1995 | Reneau | 220/319 |
| 5,447,294 A | 9/1995 | Sakata et al. | 266/257 |
| 5,456,759 A | 10/1995 | Stanford, Jr. et al. | 134/1 |
| 5,470,393 A | 11/1995 | Fukazawa | 134/3 |
| 5,474,812 A | 12/1995 | Truckenmuller et al. | 427/430.1 |
| 5,482,564 A | 1/1996 | Douglas et al. | 134/18 |
| 5,486,212 A | 1/1996 | Mitchell et al. | 8/142 |
| 5,494,526 A | 2/1996 | Paranjpe | 134/1 |
| 5,500,081 A | 3/1996 | Bergman | 156/646.1 |
| 5,501,761 A | 3/1996 | Evans et al. | 156/344 |
| 5,503,176 A | 4/1996 | Dunmire et al. | 137/15.01 |
| 5,505,219 A | 4/1996 | Lansberry et al. | 134/105 |
| 5,509,431 A | 4/1996 | Smith, Jr. et al. | 134/95.1 |
| 5,514,220 A | 5/1996 | Wetmore et al. | 134/22.18 |
| 5,522,938 A | 6/1996 | O'Brien | 134/1 |
| 5,526,834 A | 6/1996 | Mielnik et al. | 134/105 |
| 5,533,538 A | 7/1996 | Marshall | 134/104.4 |
| 5,547,774 A | 8/1996 | Gimzewski et al. | 428/694 ML |
| 5,550,211 A | 8/1996 | DeCrosta et al. | 528/480 |
| 5,571,330 A | 11/1996 | Kyogoku | 118/719 |
| 5,580,846 A | 12/1996 | Hayashida et al. | 510/175 |
| 5,589,082 A | 12/1996 | Lin et al. | 216/2 |
| 5,589,105 A | 12/1996 | DeSimone et al. | 252/351 |
| 5,589,224 A | 12/1996 | Tepman et al. | 427/248.1 |
| 5,621,982 A | 4/1997 | Yamashita et al. | 34/203 |
| 5,629,918 A | 5/1997 | Ho et al. | 369/112 |
| 5,632,847 A | 5/1997 | Ohno et al. | 156/344 |
| 5,635,463 A | 6/1997 | Muraoka | 510/175 |
| 5,637,151 A | 6/1997 | Schulz | 134/2 |
| 5,641,887 A | 6/1997 | Beckman et al. | 546/26.2 |
| 5,644,855 A | 7/1997 | McDermott et al. | 34/516 |
| 5,649,809 A | 7/1997 | Stapelfeldt | 417/63 |
| 5,656,097 A | 8/1997 | Olesen et al. | 134/1 |
| 5,665,527 A | 9/1997 | Allen et al. | 430/325 |
| 5,669,251 A | 9/1997 | Townsend et al. | 68/58 |
| 5,676,705 A | 10/1997 | Jureller et al. | 8/142 |

| | | | |
|---|---|---|---|
| 5,679,169 A | 10/1997 | Gonzales et al. | 134/1.3 |
| 5,679,171 A | 10/1997 | Saga et al. | 134/3 |
| 5,683,473 A | 11/1997 | Jureller et al. | 8/142 |
| 5,683,977 A | 11/1997 | Jureller et al. | 510/286 |
| 5,688,879 A | 11/1997 | DeSimone | 526/89 |
| 5,700,379 A | 12/1997 | Biebl | 216/2 |
| 5,702,228 A | 12/1997 | Tamai et al. | 414/744.5 |
| 5,706,319 A | 1/1998 | Holtz | 376/203 |
| 5,726,211 A | 3/1998 | Hedrick et al. | 521/61 |
| 5,730,874 A | 3/1998 | Wai et al. | 210/638 |
| 5,739,223 A | 4/1998 | DeSimone | 526/89 |
| 5,746,008 A * | 5/1998 | Yamashita et al. | 34/211 |
| 5,769,588 A | 6/1998 | Toshima et al. | |
| 5,783,082 A | 7/1998 | DeSimone et al. | 210/634 |
| 5,797,719 A | 8/1998 | James et al. | 417/46 |
| 5,798,126 A * | 8/1998 | Fujikawa et al. | 425/78 |
| 5,798,438 A | 8/1998 | Sawan et al. | 528/483 |
| 5,804,607 A | 9/1998 | Hedrick et al. | 521/64 |
| 5,866,005 A | 2/1999 | DeSimone et al. | 210/634 |
| 5,868,856 A | 2/1999 | Douglas et al. | 134/2 |
| 5,868,862 A | 2/1999 | Douglas et al. | 134/26 |
| 5,872,257 A | 2/1999 | Beckman et al. | 546/336 |
| 5,873,948 A | 2/1999 | Kim | 134/19 |
| 5,881,577 A | 3/1999 | Sauer et al. | 68/5 |
| 5,882,165 A * | 3/1999 | Maydan et al. | 414/217 |
| 5,888,050 A | 3/1999 | Fitzgerald et al. | 417/46 |
| 5,898,727 A * | 4/1999 | Fujikawa et al. | 373/110 |
| 5,900,107 A * | 5/1999 | Murphy et al. | 156/359 |
| 5,900,354 A | 5/1999 | Batchelder | 430/395 |
| 5,904,737 A * | 5/1999 | Preston et al. | 8/158 |
| 5,906,866 A | 5/1999 | Webb | |
| 5,908,510 A | 6/1999 | McCullough et al. | 134/2 |
| 5,928,389 A * | 7/1999 | Jevtic | 29/25.01 |
| 5,932,100 A | 8/1999 | Yager et al. | 210/634 |
| 5,934,856 A * | 8/1999 | Asakawa et al. | 414/217 |
| 5,934,991 A * | 8/1999 | Rush | 454/187 |
| 5,944,996 A | 8/1999 | DeSimone et al. | 210/634 |
| 5,965,025 A | 10/1999 | Wai et al. | 210/634 |
| 5,975,492 A | 11/1999 | Brenes | |
| 5,976,264 A | 11/1999 | McCullough et al. | 134/2 |
| 5,979,306 A * | 11/1999 | Fujikawa et al. | 100/90 |
| 5,980,648 A | 11/1999 | Adler | 134/34 |
| 5,981,399 A * | 11/1999 | Kawamura et al. | 438/715 |
| 5,989,342 A * | 11/1999 | Ikeda et al. | 118/52 |
| 6,005,226 A * | 12/1999 | Aschner et al. | 219/390 |
| 6,017,820 A | 1/2000 | Ting et al. | 438/689 |
| 6,024,801 A | 2/2000 | Wallace et al. | 134/1 |
| 6,029,371 A | 2/2000 | Kamikawa et al. | 34/516 |
| 6,035,871 A | 3/2000 | Eui-Yeol | 134/61 |
| 6,037,277 A | 3/2000 | Masakara et al. | 438/787 |
| 6,053,348 A | 4/2000 | Morch | 220/263 |
| 6,056,008 A | 5/2000 | Adams et al. | 137/487.5 |
| 6,067,728 A | 5/2000 | Farmer et al. | 34/470 |
| 6,077,053 A | 6/2000 | Fujikawa et al. | 417/399 |
| 6,077,321 A | 6/2000 | Adachi et al. | 29/25.01 |
| 6,082,150 A | 7/2000 | Stucker | 68/18 R |
| 6,085,935 A | 7/2000 | Malchow et al. | 220/813 |
| 6,097,015 A | 8/2000 | McCullough et al. | 219/686 |
| 6,114,044 A | 9/2000 | Houston et al. | 428/447 |
| 6,122,566 A | 9/2000 | Nguyen et al. | |
| 6,128,830 A | 10/2000 | Bettcher et al. | 34/404 |
| 6,145,519 A | 11/2000 | Konishi et al. | 134/95.2 |
| 6,149,828 A | 11/2000 | Vaartstra | 216/57 |
| 6,159,295 A * | 12/2000 | Maskara et al. | 118/688 |
| 6,164,297 A * | 12/2000 | Kamikawa | 134/24 |
| 6,186,722 B1 * | 2/2001 | Shirai | 414/217 |
| 6,203,582 B1 * | 3/2001 | Berner et al. | 29/25.01 |
| 6,216,364 B1 * | 4/2001 | Tanaka et al. | 34/448 |
| 6,228,563 B1 * | 5/2001 | Starov et al. | 430/327 |
| 6,235,634 B1 * | 5/2001 | White et al. | 438/680 |
| 6,239,038 B1 * | 5/2001 | Wen | 438/745 |
| 6,241,825 B1 * | 6/2001 | Wytman | 118/733 |
| 6,242,165 B1 | 6/2001 | Vaartstra | 430/329 |
| 6,244,121 B1 * | 6/2001 | Hunter | 73/865.9 |
| 6,251,250 B1 * | 6/2001 | Keigler | 205/89 |
| 6,277,753 B1 | 8/2001 | Mullee et al. | 438/692 |
| 6,286,231 B1 * | 9/2001 | Bergman et al. | 34/410 |
| 6,305,677 B1 * | 10/2001 | Lenz | 269/13 |
| 6,306,564 B1 | 10/2001 | Mullee | 430/329 |
| 6,334,266 B1 * | 1/2002 | Moritz et al. | 34/337 |
| 6,344,174 B1 * | 2/2002 | Miller et al. | 422/98 |
| 6,355,072 B1 | 3/2002 | Racette et al. | |
| 6,388,317 B1 * | 5/2002 | Reese | 257/713 |
| 6,389,677 B1 * | 5/2002 | Lenz | 29/559 |
| 6,418,956 B1 * | 7/2002 | Bloom | 137/14 |
| 6,436,824 B1 * | 8/2002 | Chooi et al. | 438/687 |
| 6,454,519 B1 | 9/2002 | Toshima et al. | |
| 6,454,945 B1 * | 9/2002 | Weigl et al. | 210/634 |
| 6,464,790 B1 * | 10/2002 | Sherstinsky et al. | 118/715 |
| 6,521,466 B1 * | 2/2003 | Castrucci | 438/5 |
| 6,541,278 B2 * | 4/2003 | Morita et al. | 438/3 |
| 6,546,946 B2 * | 4/2003 | Dunmire | 137/15.18 |
| 6,550,484 B1 * | 4/2003 | Gopinath et al. | 134/1.2 |
| 6,558,475 B1 * | 5/2003 | Simons et al. | 134/21 |
| 6,561,213 B2 | 5/2003 | Wang et al. | 137/263 |
| 6,561,220 B2 | 5/2003 | McCullough et al. | 137/565.12 |
| 6,561,481 B1 | 5/2003 | Filonczuk | 251/129.12 |
| 6,561,767 B2 | 5/2003 | Berger et al. | 417/53 |
| 6,564,826 B2 | 5/2003 | Shen | 137/505.18 |
| 2002/0001929 A1 | 1/2002 | Biberger et al. | 438/584 |
| 2003/0205510 A1 | 11/2003 | Jackson | |
| 2004/0020518 A1 | 2/2004 | DeYoung et al. | |

FOREIGN PATENT DOCUMENTS

| | | | |
|---|---|---|---|
| DE | 39 06 735 C2 | 9/1990 | D06L/3/00 |
| DE | 39 06 737 A1 | 9/1990 | D06M/11/59 |
| DE | 44 29 470 A1 | 3/1995 | D06P/5/04 |
| DE | 43 44 021 A1 | 6/1995 | D06P/1/16 |
| DE | 198 60 084 A1 | 7/2000 | H01L/21/3213 |
| EP | 0 244 951 A2 | 11/1987 | H01L/21/00 |
| EP | 0 272 141 A2 | 6/1988 | H01L/21/00 |
| EP | 0 283 740 A2 | 9/1988 | C22B/3/00 |
| EP | 0 302 345 A2 | 2/1989 | C22B/3/00 |
| EP | 0 370 233 A1 | 5/1990 | C22B/3/00 |
| EP | 0 391 035 A2 | 10/1990 | C23G/5/00 |
| EP | 0 453 867 A1 | 10/1991 | F16K/51/02 |
| EP | 0 518 653 B1 | 12/1992 | D06L/1/02 |
| EP | 0 536 752 A2 | 4/1993 | C11D/3/20 |
| EP | 0 572 913 A1 | 12/1993 | B01D/11/02 |
| EP | 0 587 168 A1 | 3/1994 | B08B/7/00 |
| EP | 0 620 270 A3 | 10/1994 | C11D/7/50 |
| EP | 0 679 753 B1 | 11/1995 | D06F/43/00 |
| EP | 727711 A | 2/1996 | H01L/21/027 |
| EP | 0 711 864 B1 | 5/1996 | D06G/1/00 |
| EP | 0 726 099 A2 | 8/1996 | B08B/5/00 |
| EP | 0 822 583 A2 | 2/1998 | H01L/21/306 |
| EP | 0 829 312 A2 | 3/1998 | B08B/3/08 |
| EP | 0 836 895 A2 | 4/1998 | B08B/7/00 |
| EP | 0 903 775 A2 | 3/1999 | H01L/21/00 |
| GB | 2 003 975 | 3/1979 | F04B/43/06 |
| GB | 2 193 482 | 2/1988 | B25J/18/02 |
| JP | 56-142629 | 11/1981 | H01L/21/205 |
| JP | 60-192333 | 9/1985 | H01L/21/30 |
| JP | 60-238479 | 11/1985 | C23C/14/56 |
| JP | 60-246635 | 12/1985 | H01L/21/302 |
| JP | 61-231166 | 10/1986 | C23C/14/24 |
| JP | 62-125619 | 6/1987 | H01L/21/30 |
| JP | 63-303059 | 12/1988 | C23C/14/22 |
| JP | 1045131 | 2/1989 | B01D/11/04 |
| JP | 2-148841 | 6/1990 | H01L/21/306 |
| JP | 2-209729 | 8/1990 | H01L/21/88 |
| JP | 2-304941 | 12/1990 | H01L/21/56 |

| | | | | |
|---|---|---|---|---|
| JP | 7142333 A | 6/1995 | ......... | H01L/21/027 |
| JP | 8-186140 | 7/1996 | ........... | H01L/21/56 |
| JP | 8-206485 | 8/1996 | .............. | B01J/3/06 |
| JP | 8222508 | 8/1996 | ......... | H01L/21/027 |
| JP | 10-144757 | 5/1998 | ........... | H01L/21/68 |
| JP | 10-335408 | 12/1998 | ........... | H01L/21/31 |
| JP | 11-200035 | 7/1999 | ........... | C23C/14/34 |
| JP | 2000/106358 | 4/2000 | ....... | H01L/21/3065 |
| WO | WO 87/07309 | 12/1987 | ........... | C23C/16/00 |
| WO | WO 90/06189 | 6/1990 | ............. | B08B/7/00 |
| WO | WO 90/13675 | 11/1990 | ............. | C22B/3/00 |
| WO | WO 91/12629 | 8/1991 | ........... | H01L/21/00 |
| WO | WO 93/14255 | 7/1993 | ............ | D06B/5/16 |
| WO | WO 93/14259 | 7/1993 | ........... | D06M/11/76 |
| WO | WO 93/20116 | 10/1993 | ........... | C08F/14/18 |
| WO | WO 96/27704 | 9/1996 | ............. | D06L/1/00 |
| WO | WO 99/18603 | 4/1999 | ........... | H01L/21/00 |
| WO | WO 99/49998 | 10/1999 | ............. | B08B/5/00 |
| WO | WO 00/36635 | 6/2000 | ........... | H01L/21/00 |
| WO | WO 01/10733 A1 | 2/2001 | ........... | B65D/55/00 |
| WO | WO 01/33615 A3 | 5/2001 | ........... | H01L/21/00 |
| WO | WO 01/55628 A1 | 8/2001 | ........... | F16K/51/02 |
| WO | WO 01/68279 A2 | 9/2001 | ............. | B08B/7/00 |
| WO | WO 01/74538 A1 | 10/2001 | ............. | B24C/1/00 |
| WO | WO 01/78911 A1 | 10/2001 | ............. | B08B/3/00 |
| WO | WO 01/85391 A2 | 11/2001 | | |
| WO | WO 01/94782 A3 | 12/2001 | ........... | F04B/43/02 |
| WO | WO 02/16051 A2 | 2/2002 | | |
| WO | WO 03/030219 A2 | 10/2003 | | |

OTHER PUBLICATIONS

Bob Agnew, "WILDEN Air–Operated Diaphragm Pumps", Process & Industrial Training Technologies, Inc., 1996.

"A Comparison of Chilled DI Water/Ozone and Co2–Based Supercritical Fluids as Replacements for Photoresist–Stripping Solvents" by J.B. Rubin et al., Physical Organic Chemistry Group (CST–12) Chemical Science & Technology Division Los Alamos National Laboratory, Los Alamos, New Mexico.

Guan, Z. et al., "Fluorocarbon–Based Heterophase Polymeric Materials. 1. Block Copolymer Surfactants for Carbon Dioxide Applications," Macromolecules, vol. 27, 1994, pp 5527–5532.

International Journal of Environmentally Conscious Design & Manufacturing, vol. 2, No. 1, 1993, p. 83.

Journal of the American Ceramic Society, vol. 72, No. 6, pp. 872–874.

Ziger, D.H. et al., "Compressed Fluid Technology: Application to RIE Developed Resists," AIChE Journal, vol. 33, No. 10, Oct. 1987, pp 1585–1591.

Kirk–Othmer, "Encyclopedia of Chemical Terminology," 3rd ed., Supplement Volume, "Alcohol Fuels to Toxicology," 1984, pp. 872–893.

"Cleaning with Supercritical $CO_2$," NASA Tech Briefs, MFS–29611, Marshall Space Flight Center, Alabama, Mar. 1979.

Basta, N., "Supercritical Fluids: Still Seeking Acceptance," Chemical Engineering, vol. 92, No. 3, Feb. 24, 1985, 14.

Takahashi, D., "Los Alomos Lab finds way to cut chip toxic waste," Wall Street Journal, Jun. 22, 1998.

Supercritical CO, process offers less mess from semiconductor plants, Chemical Engineering Magazine, pp. 27 & 29, Jul. 1998.

Sun, Y.P. et al., "Preparation of polymer–protected semiconductor nanoparticles through the rapid expansion of supercritical fluid solution," Chemical Physics Letters, pp. 585–588, May 22, 1998.

Jackson, K. et al., "Surfactants and Micromulsions in Supercritical Fluids" in "Supercritical Fluid Cleaning." Noyes Publications, Westwood, NJ, pp. 87–120, Spring 1998.

Kryszewski, M., "Production of Metal and Semiconductor Nanoparticles in Polymer Systems," Polymeri, pp. 65–73, Feb. 1998

Bakker, G.L. et al., "Surface Cleaning and Carbonaceous Film Removal Using High Pressure, High Temperature Water, and Water/C02 Mixtures," J. Electrochem, Soc, vol. 145, No. 1, pp. 284–291, Jan. 1998.

Ober, C.K. et al., "Imaging polymers with supercritical carbon dioxide," Advanced Materials, vol. 9, No. 13, 99. 1039–1043, Nov. 3, 1997.

Russick, E.M. et al., "Supercritical carbon dioxide extraction of solvent from micromachined structures." Supercritical Fluids Extraction and Pollution Prevention, ACS Symposium Series, vol. 670, pp. 255–269,Oct. 21, 1997.

Dahmen, N. et al., Supercritical fluid extraction of grinding and metal cutting waste contaminated with oils, Supercritical Fluids—Extraction and Pollution Prevention, ACS Symposium Series, vol. 670, pp. 270–279, Oct. 21, 1997.

Wai, C.M., "Supercritical fluid extraction: metals as complexes," J. Chromatography A, vol. 785, pp. 369–383, Oct. 17, 1997.

Xu, C. et al., Submicron–sized spherical yttrium oxide based phosphors prepared by supercritical CO2–assisted aerosolization and pyrolysis, Appl. Phys. Lett., vol. 71, No. 12, Sep. 22, 1997.

Tomioka Y, et al., "Decomposition of tetramethylammonium (TMA) in a positive photoresist developer by supercritical water," Abstracts of Papers $214^{th}$ ACS Natl Meeting, American Chemical Society, Abstract No. 108, Sep. 7, 1997.

Klein, H. et al., "Cyclic organic carbonates serve as solvents and reactive diluents," Coatings Worlds, pp. 38–40, May 1997.

Buhler, J. et al., Liner array of complementary metal oxide semiconductor double–pass micromirrors, Opt. Eng., vol. 36, No. 5, pp 1391–1398, May 1997.

Jo, M.H. et al., Evaluation of SIO2 aerogel thin film with ultra low dielectric constant as an intermetal dielectric, Microelectronic Engineering, vol. 33, pp. 343–348, Jan. 1997.

McClain, J.B. et al., "Design of Nonionic Surfactants for supercritical carbon dioxide," Science, vol. 27, Dec. 20, 1996.

Znaidi, L. et al., "Patch and semi–continous synthesis of magnesium oxide powders from hydrolysis and supercritical treatment of Mg(OCH3)2," Materials Research Bulletin, vol. 31, No. 12, pp. 1527–1335, Dec. 1996.

Tadros, M.E., "Synthesis of titanium dioxide particles in supercritical CO2" J. Supercritical Fluids, vol. 9, No. 3, pp. 172–176, Sep. 1996.

Courtecuisse, V.G. et al., Kinetics of the titanium isopropoxide decomposition in supercritical isopropyl alcohol, ind. Eng. Chem. Res., vol. 35, No. 8, pp. 2539–2545, Aug. 1996.

Gabor, A, et al., "Block and random copolymer resists designed for 193 nm lithography and enviromentally friendly supercritical CO2 Development," Dept. Mat. Sci. & Eng. Cornell Univ., SPIE, vol. 2724, pp. 410–417, Jun. 1995.

Schimek, G. L. et al., "Supercritical ammonium synthesis and charaterization of four new alkali metal silver antimony sulfides . . . ," J. Solid State Chemistry, vol. 123 pp. 277–284, May 1996.

Gallagher–Wetmore, P. et al., "Supercritical fluid processing: Opportunities for new resist materials and processes," IBM research Division, SPIE, vol. 2725, pp. 289–299, Apr. 1996.

Papathomas, K.J. et al., "Debonding of photoresists by organic solvents," J. Applied Polymer Science, vol. 59, pp. 2029–2037, Mar. 28, 1996.

Watkins, J.J. et al., "Polymer/metal nanocomposite synthesis in supercritical CO2," Chemistry of Materials, vol. 7, No. 11, Nov. 1995.

Gloyna, E.F. et al., "Supercritical water oxidation research and development update," Environment Progess, vol. 14, No. 3. Pp. 182–192, Aug. 1995.

Gallagher–Wetmore, P. et al., Supercritical fluid processing: A new dry technique for photoresist developing, IBM Research Division, SPIE vol. 2438, pp. 694–708, Jun. 1995.

Gabor, A. H. et al., "Silicon–containing block copolymer resist materials" Microelectronics Technology—Polymers for Advanced Imaging and Packaging , ACS Symposium Series, vol. 614, pp. 281–298, Apr. 1995.

Tsiartas, P.C. et al., "Effect of molecular weight distribution on the dissolution properties of novolac blends," SPIE, vol. 2438, pp. 264–271, 1995.

Allen, R.D. et al., "Performance properties of near–monodisperse novolak resins,"SPIE, vol. 2438, pp. 250–260, 1995.

Wood, P.T. et al., "Synthesis of new channeled structures in supercritical amines . . . ," Inorg. Chem., vol. 33, pp. 1556–1558, 1994.

Jerome, J.E. et al., "Synthesis of new low–dimensional quaternary compounds . . . ," Inorg. Chem, vol. 33, 1733–1734, 1994.

McHardy, J. et al., "Progress in supercritical CO2 cleaning," SAMPE Jour., vol. 29, No. 5, pp. 20–27, Sep. 1993.

Purtell, R, et al., Precision parts cleaning using supercritical fluids, J. Vac, Sci, Technol. A. vol. 11, No. 4, Jul. 1993.

Bok, E, et al., "Supercritical fluids for single wafer cleaning," Solids State Technology, pp. 117–120, Jun. 1992.

Adschiri, T. et al., "Rapid and continuous hydrothermal crystallization of metal oxide particles in supercritical water," J. Am. Ceram. Soc., vol. 75, No. 4, pp. 1019–1022, 1992.

Hansen, B.N. et al., "Supercritical fluid transport—chemical deposition of films,"Chem. Mater., vol. 4, No. 4, pp, 749–752, 1992.

Page, S.H. et al., "Predictability and effect of phase behavior of CO2/ propylene carbonate in supercritical fluid chromatography," J. Microl. Sep, vol. 3, No. 4, pp. 355369, 1991.

Brokamp, T. et al., "Synthese und Kristallstruktur eines gemischivalenten Lithium–Tantainirids Li2Ta3Ns," J. Alloys and Compounds, vol. 176. Pp. 47–60, 1991.

Hybertson, B.M. et al., "Deposition of palladium films by a novel supercritical fluid transport chemical deposition process," Mat. Res. Bull., vol. 26, pp. 1127–1133, 1991.

Ziger, D. H. et al., "Compressed fluid technology: Application to RIE–Developed resists," AiChE Jour., vol. 33, No. 10, pp. 1585–1591, Oct. 1987.

Matson, D.W. et al., "Rapid expansion of supercritical fluid solutions: Solute formation of powders, thin films, and fibers," Ind. Eng. Chem. Res., vol. 26, No. 11, pp. 2298–2306, 1987.

Tolley, W.K. et al., "Stripping organics from metal and mineral surfaces using supercritical fluids," Separation Science and Technology, vol. 22, pp. 1087–1101, 1987.

"Final report on the safety assessment of propylene carbonate," J. American College of Toxicology, vol. 6, No. 1, pp. 23–51.

* cited by examiner

REMOVAL OF PHOTORESIST AND PHOTORESIST RESIDUE FROM SEMICONDUCTORS USING SUPERCRITICAL CARBON DIOXIDE PROCESS

RELATED APPLICATIONS

This application is a Divisional Application of the application Ser. No. 09/389,788, entitled, "REMOVAL OF PHOTORESIST AND PHOTORESIST RESIDUE FROM SEMICONDUCTORS USING SUPERCRITICAL CARBON DIOXIDE PROCESS", filed Sep. 3, 1999, now U.S. Pat. No. 6,509,141 B2, issued Jan. 21, 2003, which is a Continuation Application of the U.S. application Ser. No. 09/085,391, entitled "REMOVAL OF PHOTORESIST OR PHOTORESIST RESIDUE FROM SEMICONDUCTORS USING SUPERCRITICAL CARBON DIOXIDE PROCESS", filed May 27, 1998, now U.S. Pat. No. 6,306,564 B1, issued Oct. 23, 2001, which claims priority from U.S. Provisional Application No. 60/047,739, filed May 27, 1997, the contents of which are hereby incorporated by reference.

FIELD OF THE INVENTION

The present invention relates to the field of removal of photoresist and photoresist residue from semiconductor wafers. More particularly, the present invention relates to the field of removal of photoresist and photoresist residue from semiconductor wafers using supercritical carbon dioxide.

BACKGROUND OF THE INVENTION

Manufacture of semiconductor devices requires application and subsequent removal of a photoresist chemical from a surface of a semiconductor wafer. The removal of the photoresist chemical, commonly known as stripping, may be immediately preceded by a plasma ashing, etching, or other semiconductor manufacturing step. These steps can degrade or carbonize the photoresist chemical and leave a photoresist residue that is difficult to remove by current stripping methods. The current stripping methods require that the wafers be dipped into baths of commercially available chemical mixtures known as strippers. The baths may employ heat or ultrasonic augmentation. Typically, the baths employ immersion times of twenty to thirty minutes to achieve complete removal of photoresist or photoresist residue from the wafer surface.

What is needed is a more effective method of removing photoresist.

What is needed is a more effective method of removing photoresist residue.

What is needed is a more efficient method of removing photoresist.

What is needed is a more efficient method of removing photoresist residue.

SUMMARY OF THE INVENTION

The present invention is a method of removing a photoresist or a photoresist residue from a semiconductor substrate. The semiconductor substrate with the photoresist or the photoresist residue on a surface of the semiconductor substrate is placed within a pressure chamber. The pressure chamber is then pressurized. Supercritical carbon dioxide and a stripper chemical are introduced into the pressure chamber. The supercritical carbon dioxide and the stripper chemical are maintained in contact with the photoresist or the photoresist residue until the photoresist or the photoresist residue is removed from the semiconductor substrate. The pressure chamber is then flushed and vented.

Preferred types of stripper chemicals include, but are not limited to, N-methyl pyrrolidone (NMP), di-siopropyl amine, tri-isopropyl amine, mono-ethyl amine, diglycol amine, hydroxyl amine, tertiary amines, and other amines, catechol, ammonium fluoride, ammonium bifluoride, methylacetoacetamide, ozone, propylene glycol monoethyl ether acetate, acetylacetone, dibasic esters, ethyl lactate, $CHF_3$, $BF_3$, other fluorinated compounds and mixtures thereof. In accordance with the embodiments of the invention, one or more organic solvents, alone or in combination with one or more of the aforementioned stripper chemicals is used along with supercritical $CO_2$ to remove photoresist and/or photoresist residue from a substrate. Suitable organic solvents include, but are not limited to, alcohols (such as methanol, ethanol, propanol, and isopropanol (IPA)) ethers (such as diethyl ether), ketones (such as acetone), diacetone alcohol, dimethyl sulfoxide (DMSO), glycols (such as ethylene glycol) and combinations thereof. The amount of stripper chemical(s) and organic solvent(s) that are used during a cleaning step, in accordance with the embodiments of the invention, is preferably less than 15% $v_c/v_v$, where $v_c$ is the liquid volume of stripper chemical(s) and organic solvent(s) and $v_v$ is the volume of a pressure chamber or a processing chamber.

DETAILED DESCRIPTION OF THE PREFERRED EMBODIMENT

The preferred embodiment of the present invention utilizes the high solvency and cleaning characteristics of supercritical carbon dioxide to assist in the stripping process of photoresist or photoresist residue. Only a small fraction of a stripper chemical is required to affect the stripping process compared to the prior art. In the preferred embodiment of the present invention, the supercritical carbon dioxide carries the stripper chemical onto the wafer to be cleaned and is then recycled back to a carbon dioxide compressor for reuse. The stripper chemical is typical of chemicals found in commercially available stripper products. The high degree of solvency and solubilizing ability provided by the supercritical carbon dioxide enhances the removal of the photoresist or the photoresist residue. The high solubilizing ability provided by the supercritical carbon dioxide is well known to science and has been exploited in numerous other applications, for example in cleaning of metal parts.

Solvency of the supercritical carbon dioxide increases with pressure. The supercritical carbon dioxide effectively carries a small amount of the stripper chemical onto submicron surface features of modern semiconductor devices because diffusivity and viscosity of the supercritical carbon dioxide is similar to a gas phase and because density of the supercritical carbon dioxide is nearly equal to a liquid phase. The supercritical carbon dioxide also carries away the photoresist, or the photoresist residue, and remaining stripper chemical from the surface of the wafer. Thus, it is possible to use the small amount of the stripper chemical to perform the stripping process and to also carry away remaining chemicals and residue.

Figure 1:
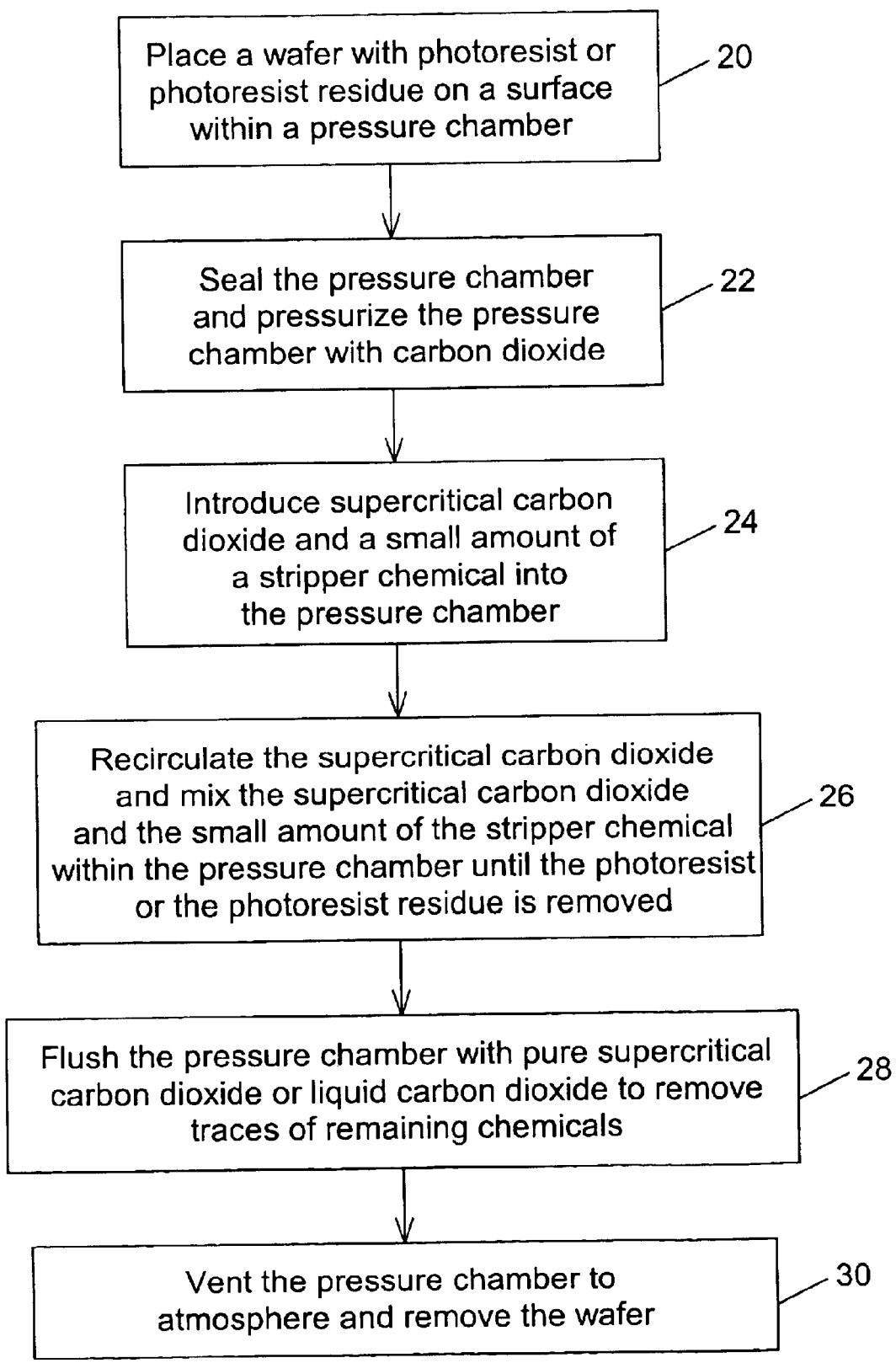
FIG. 1 is a flow chart illustrating the steps of a method of the present invention.

The preferred embodiment of the present invention is illustrated in FIG. 1. A wafer with the photoresist or the photoresist residue is placed in a pressure chamber in a first process step 20. The pressure chamber is sealed and pressurized with carbon dioxide in a second process step 22. As pressure inside the pressure chamber increases, the carbon dioxide becomes liquid and then reaches supercritical temperature and supercritical pressure. Typical process conditions range from 20 to 70° C. and from 1,050 to 6,000 psig.

When desired process conditions are reached, the small amount of the stripper chemical is introduced into a supercritical carbon dioxide stream and thus added into the pressure chamber in a third process step 24. A volume ratio of the stripper chemical to the supercritical carbon dioxide is preferably 0.1 to 15.0 v/v %. The stripper chemical is preferably selected from the group consisting of N-methyl pyrrolidone, monoethanol amine, di-isopropyl amine, tri-isopropyl amine, diglycol amine, hydroxyl amine, catechol, and a mixture thereof. Monoethanol amine, hydroxyl amine, and catechol have only marginal utility.

Processing continues with recirculation of the supercritical carbon dioxide and with mixing of the supercritical carbon dioxide and the stripper chemical within the pressure chamber in a fourth process step 26. The fourth process step 28 continues until the photoresist or the photoresist residue is removed from the wafer, typically from 3 to 15 minutes. The pressure chamber is then flushed with pure supercritical carbon dioxide or liquid carbon dioxide to remove traces of the remaining chemicals in a fifth process step 28. Finally, the pressure chamber is vented to atmosphere and the wafer is removed in a sixth process step 30. An optional final process step rinses the wafer with deionized or ultra-pure water.

Use of the supercritical carbon dioxide in combination with the small amount of the stripper chemical greatly enhances the removal of the photoresist, or the photoresist residue, from surfaces of semiconductor devices. The amount of the stripper chemical required to effectively remove the photoresist or the photoresist residue from the wafer is reduced significantly by using supercritical carbon dioxide compared to the prior art wet chemical stripping methods. An amount of hazardous chemical waste generated as a result of using the supercritical carbon dioxide and the stripper chemical is significantly less than the prior art wet chemical stripping methods. The supercritical carbon dioxide and the stripper chemical eliminate a need for the prior art wet chemical stripping methods along with using large amounts of chemicals and expensive wet baths. Also, the supercritical carbon dioxide and the stripper chemical remove traces of organic contamination from the wafer.

In an alternative embodiment of the present invention, a small amount of an organic solvent is added to the supercritical carbon dioxide and the stripper chemical. The organic solvent is preferably selected from the group consisting of alcohols, ethers, and glycols. The organic solvent enhances removal of the traces of the organic contamination from the wafer.

Figure 2:
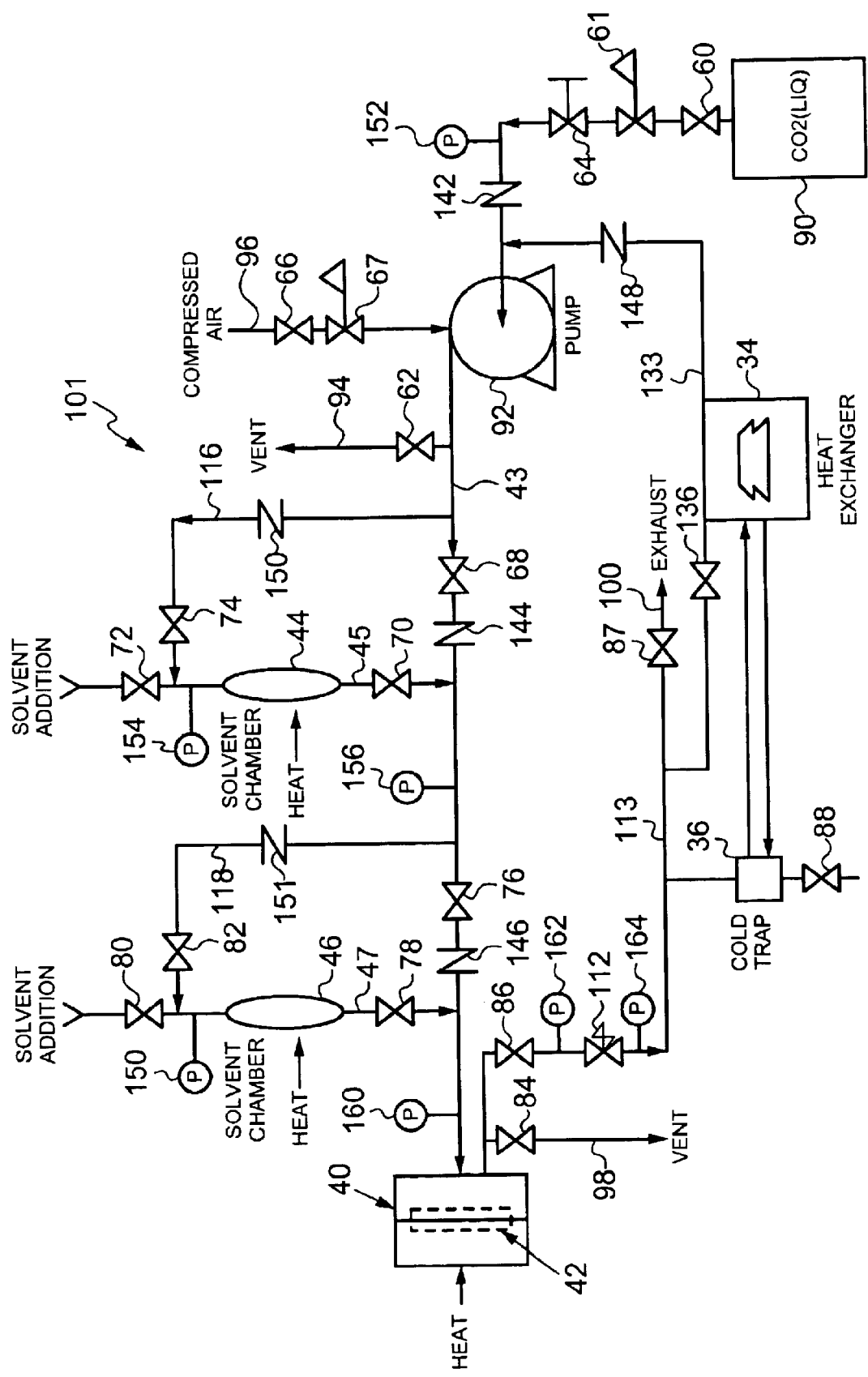
FIG. 2 is a schematic diagram of a photoresist removal system used to practice a method of the present invention.

FIG. 2 is a schematic diagram of a resist removal system 101 in accordance with one embodiment of the present invention. Below, the components of the system 101 are described with reference to their function, in accordance with one embodiment of the invention.

In the removal system 101, a removal process is preferably initiated by activating the heat exchanger 34 to reduce the temperature of coolant flowing through the cold trap 36. Then, a system pre-heating step brings the pressure vessel 40, including the wafer chamber 42 and the solvent chambers 44 and 46, to a preferred operating temperature of between 45 and 65° C. before a wafer (not shown) is inserted into the pressure vessel 40. Those skilled in the art will appreciate that the pressure vessel 40 may alternatively be maintained at a preferred processing temperature to facilitate throughput, or the temperature may be gradually increased from ambient temperature after the wafer is inserted into the pressure vessel 40. In this way, stress is reduced on the wafer, on features fabricated on the wafer, or on semiconductor devices other than wafers. Although electrical resistance heaters are preferably built into the walls of the pressure vessel 40 and the solvent chambers 44 and 46 to heat them, those skilled in the art will appreciate that other conventionally available heating techniques can be used. Those skilled in the art will also appreciate that electrical resistance tape may be wrapped around all or some of the connecting lines, such as the line 43 between the pump 92 and the pressure vessel 40, and the lines 45 and 47 between the chambers 44 and 46, respectively, and the line 43. The tape can be used to maintain the temperature of parts of system 101 at or near the temperature of the pressure vessel 40 and the chambers 44 and 46.

A wafer can be placed into and removed from the wafer chamber 42 in the pressure vessel 40 either manually or automatically, using conventional wafer-handling techniques (e.g., step 20, FIG. 1). One or more wafers can be oriented horizontally or vertically and supported by clips, electrostatic or vacuum chucks, or other methods known to those skilled in the art. The pressure vessel 40 can then be sealed (e.g., step 22, FIG. 1). The pressure vessel 40 may include one or more wafer airlocks, which may comprise a gasket-mated two-piece vessel with a stationary portion and a hydraulically raised and lowered portion. Alternatively, the airlocks can be sealed by other mechanisms.

A purging step to purge the solvent chambers 44 and 46 and the pressure vessel 40 with fluid $CO_2$, preferably gaseous $CO_2$, preferably begins with all the valves 60, 61, 62, 64, 66, 67, 68, 70, 72, 74, 76, 78, 80, 82, 84, 86, 87, and 88 in a closed position. The $CO_2$ tank valve 60 is opened to allow fluid $CO_2$, preferably liquid $CO_2$, to flow from the $CO_2$ tank 90 to the pressure regulating valve 61 that ensures that the pressure is preferably greater than 750 pounds per square inch gauge pressure above ambient atmospheric pressure (psig). The vent valve 62 and the pump valve 64 are preferably sequentially opened to allow $CO_2$ into the pump 92 and through the vent 94. The valve 66 allows compressed air from the compressed air source 96 to reach the pressure regulating valve 67 that is set to ensure a pressure of between 50 and 90 psig, and preferably between 60 and 80 psig. $CO_2$ is allowed to flow out the vent 94 by cycling the pump 92 for preferably at least five seconds, before preferably sequentially opening the valves 68, 70, 72, and 74 to purge the solvent chamber 44; sequentially opening the valves 76, 78, 80, and 82 to purge the solvent chamber 46; and sequentially opening the valves 84, 86, 88 and 87 to purge the pressure vessel 40 through the vent 98, the cold trap 36, or the exhaust 100.

To purge the pressure vessel 40, the valves 88, 84, 78, 82, 74, and 70 are preferentially sequentially closed. The system pressure is then preferably adjusted between 1,000 and 2,000 psig, preferably between 1,000 and 1,500 psig, by controlling the pumping rate at the pressure regulating valve 61 and by adjusting the back pressure regulator 112. The back pressure regulator 112 is positioned between the pressure vessel 40 and the exhaust 100 and allows the line 113 to be depressurized to ambient atmospheric pressure. The $CO_2$ system flow is also preferably set to between 0.5 and 20 liters per minute (LPM), and more preferably between 3 and 6 LPM.

After the valves 70, 74, 78, and 80 are closed, solvents can be introduced into the solvent chambers 44 and 46 through the valves 72 and 80, respectively, to fill the solvent chambers 44 and 46. Next, the valves 72 and 80 are closed before the valves 74 and 82 are opened to allow the solvent loops 116 and 118 to achieve the instantaneous system pressure. Those skilled in the art will appreciate that, with the proper sequence of valve controls, chemicals can be placed into the solvent chambers any time (1) after the solvent chambers 44 and 46 and the pressure vessel 40 are purged and (2) before a flow is redirected through the solvent chambers 44 and 46.

Pressurizing the system 101 to supercritical pressures involves increasing the pressure of $CO_2$ in the system 101 to between 2,000 and 6,000 psig, more preferably between 2,500 and 4,500 psig, and most preferably between 3,000 and 3,500 psig, by adjusting the back pressure valve 112. Other generally preferred conditions for the resist removal process of the present invention range from 10 to 80° C. and 750 to 6000 psig, and preferably from 40 to 70° C. and from 1050 to 4500 psig. When the desired conditions are reached, the valve 70 is opened and the valve 68 is closed during the step of redirecting flow through the solvent chambers 44 and 46 to force the $CO_2$ stream to flow through the solvent loop 116 and the solvent chamber 44, thus introducing a small amount of one or more chemicals into the supercritical $CO_2$ stream and into the pressure vessel 40 (e.g., step 24, FIG. 1). The $CO_2$ flow rate may be reduced to 0.5 LPM, for example, to increase the chemical residence time in the pressure vessel 40.

Preferred types of chemicals include: N-Methyl Pyrrolidone (NMP), diglycol amine, hydroxyl amine, tertiary amines, catechol, ammonium fluoride, ammonium bifluoride, methylacetoacetamide, ozone, propylene glycol monoethyl ether acetate, acetylacetone, dibasic esters, ethyl lactate, $CHF_3$, $BF_3$, other fluorine containing chemicals, or a mixture of any of the above chemicals. Optionally, one or more of these chemicals or a mixture of these chemicals may be introduced into the system 101 as described above from the same or a different solvent chamber(s) 44 and 46. Other chemicals such as an organic solvent may be used independently or added to one or more of the above chemicals to remove organic contaminants from the wafer surface. The organic solvent may include, for example, an alcohol, ether, and/or glycol, such as acetone, diacetone alcohol, dimethyl sulfoxide (DMSO), ethylene glycol, methanol, ethanol, propanol, or isopropanol (IPA). Although conventionally large amounts of chemicals can be used, the applicant prefers to introduce each of these chemicals or mixtures of chemicals in an amount that is less than 15% $v_c/v_v$, and preferably from 0.1 to 15% $v_c/v_v$, where $v_c$ is the liquid volume of the chemical and $v_v$ is the volume of the pressure vessel 40. Preferably less than a few millimeters of chemicals are employed for each resist removal step, but larger amounts can be used.

The pressure vessel 40 allows the supercritical $CO_2$ to carry the solvents into the pressure vessel 40 and into contact with the resist, residue, or other contaminants on the wafer (e.g., step 24, FIG. 1). The supercritical $CO_2$ can be recirculated through the recirculation loop 133 to the pressure vessel 40 until a resist layer on the wafer is removed (e.g., step 26, FIG. 1). The cold trap 36 removes chemicals from the depressurized $CO_2$ gas in the line 113, and the heat exchanger 34 along the loop 133 cools the $CO_2$ to a liquid before it reaches the pump 92. Removing resist from the wafer is accomplished in preferably ten seconds to 15 minutes, and more preferably from 30 seconds to ten minutes, and most preferably from 30 seconds to three minutes. The valves 70 and 74 are closed and the valve 68 is opened to bypass the solvent chamber 44 to close the solvent chamber 44 and flush it with $CO_2$.

In a preferred embodiment, a second set of steps to introduce solvent, remove resist, and close a solvent chamber are performed in connection with the solvent chamber 46. The valve 78 is opened and the valve 76 is closed to force the $CO_2$ stream to flow through the loop 118 and the chamber 46, thus introducing a second chemical or group of chemicals into the $CO_2$ stream and into the pressure vessel 40. A second resist removal step can employ the same or different chemical(s) employed in the first removal step and may be conducted for a same or a different time period. Then, the valves 82 and 78 are closed and the valve 76 is opened to bypass the solvent chamber 46. In an alternative, most preferred embodiment, the valve 136 is closed and the valve 87 is open, and the steps of redirecting flow through the solvent chambers 44 and 46, removing resist, and closing the solvent chambers and flushing with $CO_2$ are each performed in ten seconds to one minute without recirculating the solvent. A 2.5 µm-thick resist layer can be removed from the surface of a 6", 8" or 300 mm diameter wafer with two removal steps of less than 30 seconds each. Thus, each wafer or group of wafers can be processed in less than one minute.

The pressure vessel 40 is then flushed for five to thirty seconds with supercritical $CO_2$ and/or liquid $CO_2$ to remove all traces of remaining chemicals (e.g., step 28, FIG. 1). Finally, the pressure vessel 40 is depressurized by closing the valves 66 and 60 and opening the valves 62, 74, 82, 84 and 87 to vent the system 101 to atmosphere (e.g., step 30, FIG. 1).

Those skilled in the art will appreciate that the system 101 preferably includes one of the directional check values 142, 144, 146, 148, 150, and 151 to ensure the direction of flow indicated in the flow lines of FIG. 2. Those skilled in the art will also appreciate that the system 101 preferably includes pressure gauges 152, 154, 156, 158, 160, 162, and 164 that may be monitored so that the pump 92 or the back pressure regulating valves may be adjusted manually or by computer, as needed.

It will be readily apparent to one skilled in the art that other various modifications may be made to the preferred embodiment without departing from the spirit and scope of the invention as defined by the appended claims.

What is claimed is:

1. An apparatus for removing a residue from a substrate, the apparatus comprising:
   a. means for generating supercritical carbon dioxide and ozone in the presence of the substrate with the residue thereon, the means for generating supercritical carbon dioxide and ozone comprising a carbon dioxide tank, a pressure vessel and at least one solvent chamber including a stripper chemical comprising ozone; and
   b. means for recirculating the supercritical carbon dioxide in a supercritical state and ozone through the pressure vessel, such that the residue is removed from the substrate.

2. The apparatus of claim 1, wherein the at least one solvent chamber is coupled to the pressure vessel through the means for recirculating.

3. The apparatus of claim 2, wherein the means for recirculating the supercritical carbon dioxide and ozone comprises a circulation loop and a compressor coupled to the pressure vessel.

4. An apparatus for removing a photoresist from a surface of a semiconductor substrate, the apparatus comprising:
   a. means for introducing supercritical carbon dioxide into a pressure vessel containing the semiconductor substrate;
   b. at least one solvent chamber with a stripper chemical therein, for introducing the stripper chemical into the pressure vessel, the stripper chemical comprising ozone;
   c. means for recirculating the supercritical carbon dioxide in a supercritical state and the stripper chemical through the pressure vessel with the semiconductor substrate therein; and
   d. means for removing the supercritical carbon dioxide and the stripper chemical from contact with the semiconductor substrate along with the photoresist.

5. The apparatus of claim 4 wherein the at least one solvent chamber is configured to hold a material selected from the group consisting of N-methyl pyrrolidone, di-isoppropyl amine, tri-isopropyl amine, diglycol amine, and a mixture thereof.

6. The apparatus of claim 4 wherein the least one solvent chamber with the stripper chemical therein is configured to introduce a volume ratio of the stripper chemical to the supercritical carbon dioxide within the range and including 0.1 to 15.0 v/v %.

7. The apparatus of claim 4 wherein the at least one solvent chamber is configured to hold an organic solvent.

8. The apparatus of claim 7 wherein the organic solvent is selected from the group consisting of alcohols, ethers, and glycols.

* * * * *